US008537952B1

(12) United States Patent
Arora

(10) Patent No.: US 8,537,952 B1
(45) Date of Patent: Sep. 17, 2013

(54) FRACTIONAL-N FREQUENCY SYNTHESIZER WITH SEPARATE PHASE AND FREQUENCY DETECTORS

(75) Inventor: Himanshu Arora, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 1123 days.

(21) Appl. No.: 12/044,532

(22) Filed: Mar. 7, 2008

Related U.S. Application Data

(60) Provisional application No. 60/893,784, filed on Mar. 8, 2007, provisional application No. 60/908,819, filed on Mar. 29, 2007.

(51) Int. Cl.
  *H03D 3/24* (2006.01)
(52) U.S. Cl.
  USPC ............ 375/376; 375/373; 375/371; 375/354
(58) Field of Classification Search
  USPC .......................................................... 375/376
  See application file for complete search history.

(56) References Cited

U.S. PATENT DOCUMENTS

| | | | |
|---|---|---|---|
| 5,121,085 A * | 6/1992 | Brown | 331/8 |
| 6,147,530 A | 11/2000 | Nogawa | |
| 6,985,551 B1 | 1/2006 | Mattisson et al. | |
| 7,072,633 B2 | 7/2006 | Gomez et al. | |
| 7,167,685 B2 | 1/2007 | Kakerow et al. | |
| 7,320,081 B2 | 1/2008 | Akasaka et al. | |
| 2003/0001637 A1 * | 1/2003 | Jung | 327/158 |

OTHER PUBLICATIONS

International Standard ISO/IEC 8802-11, Information Technology—Telecommunications and information exchange between systems—Local and metropolitan area networks—Specific requirements—Part 11: Wireless LAN Medium Access Control (MAC) and Physical Layer (PHY) Specifications (1999).

Office Action from U.S. Appl. No. 12/058,377 dated Jul. 8, 2009.

Van de Beek et al., "A 2.5-10-GHz Clock Multiplier Unit With 0.22-ps RMS Jitter in Standard 0.18-μm CMOS," IEEE Journal of Solid-State Circuits, vol. 39, No. 11, Nov. 2004, pp. 1862-1872.

Vaucher et al., "A Family of Low-Power Truly Modular Programmable Dividers in Standard 0.35-μm CMOS Technology," IEEE Journal of Solid-State Circuits, vol. 35, No. 7, Jul. 2000, pp. 1039-1045.

Miller et al., "A Multiple Modulator Fractional Divider," IEEE Transactions on Instrumentation and Measurement, vol. 40, No. 3, Jun. 1991, pp. 578-583.

Riley et al., "Delta-Sigma Modulation in Fractional-$N$ Frequency Synthesis," IEEE Journal of Solid-State Circuits, vol. 28, No. 5, May 1993, pp. 553-559.

Riley et al., "Techniques for In-Band Phase Noise Reduction in $\Delta\Sigma$ Synthesizers," IEEE Transactions on Circuits and Systems-II: Analog and Digital Signal Processing, vol. 50, No. 11, Nov. 2003, pp. 794-803.

Arora et al., "Enhanced Phase Noise Modeling of Fractional-N Frequency Synthesizers," IEEE Transactions on Circuits and Systems-I: Regular Papers, vol. 52, No. 2, Feb. 2005, pp. 379-395.

* cited by examiner

*Primary Examiner* — Kenneth Lam
*Assistant Examiner* — Michael Neff

(57) ABSTRACT

A fractional-N PLL uses separate charge pumps under the control of separate frequency and phase detectors. Phase jitter from an N divider is linearized by the use of a circuit that generates pulses from the output of the N divider. After frequency lock, the frequency detector turns off the frequency charge pump. After phase lock, activity in the phase detector down charge pump is minimized, reducing the overall noise produced by respective phase and frequency detector charge pumps.

17 Claims, 15 Drawing Sheets

*Fig. 1 - Prior Art Conventional Frac-N PLL*

*Fig. 2 - Prior Art*
*Quadrature Clock Multiplier*

Div I – Div T
Circuit

US 8,537,952 B1

FRACTIONAL-N FREQUENCY SYNTHESIZER WITH SEPARATE PHASE AND FREQUENCY DETECTORS

CROSS-REFERENCE TO RELATED APPLICATION

This application claims the benefit of U.S. Provisional Application No. 60/893,784, entitled "TECHNIQUE TO LINEARIZE DELTA-SIGMA CONTROLLED FRACTIONAL-N FREQUENCY SYNTHESIZER BY USING PHASE DETECTOR AND FREQUENCY DETECTOR," filed on Mar. 8, 2007, which is hereby incorporated by reference herein and this application further claims the benefit of U.S. Provisional Application No. 60/908,819, entitled "TECHNIQUE TO LINEARIZE DELTA-SIGMA CONTROLLED FRACTIONAL-N FREQUENCY SYNTHESIZER BY USING PHASE DETECTOR AND FREQUENCY DETECTOR," filed on Mar. 29, 2007, which is hereby incorporated by reference herein.

DESCRIPTION OF RELATED ART

A conventional fractional-N (frac-N) phase locked loop (PLL) 100 uses phase-frequency detector (PFD) 102 with a single pair of charge pumps, similar to that shown in prior art FIG. 1. In general, the goal of the circuit 100 is to allow generation of a signal $F_{VCO}$ 130 having a desired frequency by attempting to match the frequency and phase of a frequency divided signal $F_{DIV}$ 132 to a reference signal $F_{REF}$ 128. The PFD 102 compares $F_{DIV}$ 132 to $F_{REF}$ 128 and controls a charge pump 104. The charge pump 104 adds or removes charge from a loop filter 106 to change the input voltage to voltage controlled oscillator 108, which generates the signal $F_{VCO}$ 130. The signal $F_{VCO}$ 130 is provided to a divider 110, which generates the signal $F_{DIV}$ 132.

The divider 110 divides the signal by $N_k$ every $k^{th}$ clock period of $F_{REF}$. A delta-sigma modulator 112 converts input signal F 134 to a digital signal $\Delta(k)$ 136 that is combined with the division factor N at summing circuit 114. An output of the summing circuit 114 controls the instantaneous division ratio $N_k$. The VCO 108 eventually stabilizes at a frequency that is a time average of $<N+\Delta(k)>*F_{REF}$. In general, the PLL 100 first locks to the frequency $F_{REF}$ and then locks to the phase of $F_{REF}$.

A prior art clock multiplier 200 depicted in FIG. 2 uses separate phase and frequency detectors 202 and 204, respectively, to control corresponding charge pumps 206 and 208 in an integer-N PLL configuration. A filter network comprising resistor R1 210, C1 212, and C2 214 allows tuning the responses of the circuit 200 for frequency and phase locking. The output of the filter network controls the voltage controlled oscillator 216. The output, $F_{VCO}$ 230, is divided at divider 218 and divided by 2 at D flip-flops 220 and 222, which generate signals 224 and 226 that are phase shifted by 90 degrees. The phase detector 202 generates control signals indicative of differences in phase between the reference signal $F_{REF}$ 228 and the output of the D flip-flop 222. The frequency detector 204 generates control signals indicative of differences in frequency between the reference signal $F_{REF}$ 228 and the output of the D flip-flops 220 and 222.

SUMMARY OF THE DISCLOSURE

A phase locked loop (PLL) using separate frequency and phase detectors in combination with a multi-modulus divider generates control pulses for use in the phase and frequency detectors. One of the control pulses is synchronized to a rising edge of a frequency divided signal and another control pulse is synchronized to a falling edge of the frequency divided signal. The phase detector generates control signals to control a phase charge pump, which in turn controls a phase loop filter. The frequency detector generates control signals to control a frequency charge pump, which in turn controls a frequency loop filter. The phase loop filter and the frequency loop filter together control an oscillator.

DETAILED DESCRIPTION

Figure 3:
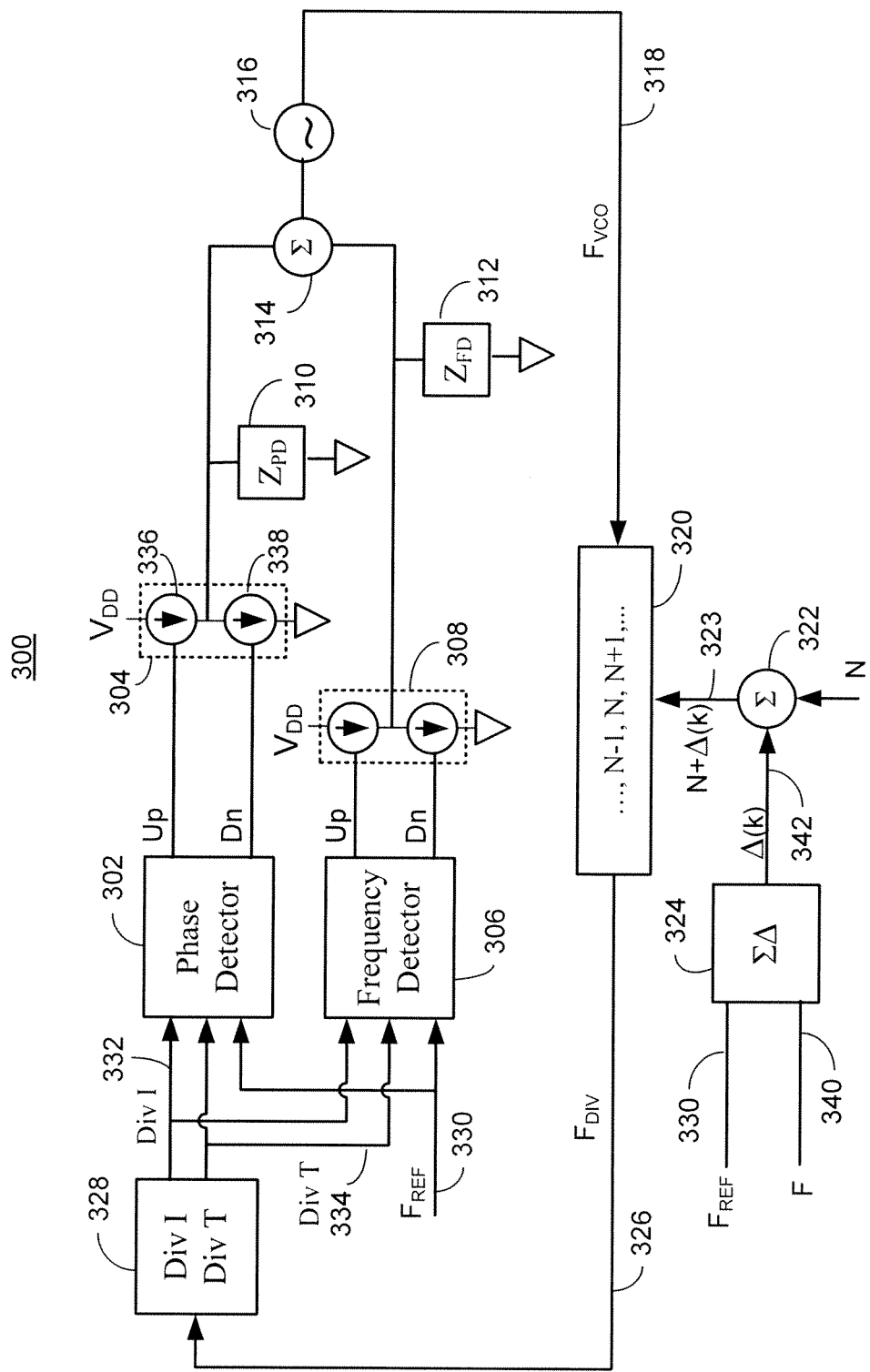
FIG. 3 is a block diagram of delta-sigma controlled fractional-N synthesizer employing a separate phase detector and frequency detector.

FIG. 3 is a block diagram of an embodiment of a fractional-N phase locked loop (PLL) 300. A voltage controlled oscillator 316 generates a signal $F_{VCO}$ 318. A multi-modulus divider (N divider) 320 divides the signal $F_{VCO}$ 318 by $N_k$ to generate a frequency divided signal $F_{DIV}$ 326. A delta-sigma modulator (DSM) 324 with accumulator length Q converts input F 340 to a digital signal $\Delta(k)$ 342, that is combined with a division factor N at summing circuit 322. An output of the summing circuit 322, $N+\Delta(k)$ is used as the input to the N divider 320. The N divider 320 may be a multi-modulus divider, that is either an integer-N divider, or a fractional-N divider. In another embodiment, $F_{DIV}$ 326 may be used as an input to the DSM 324. An output of the summing circuit 322 controls the instantaneous division ratio of the N divider 320. The VCO 316 eventually stabilizes at a frequency that is a time average of N+F/Q.

A DivI/DivT circuit 328 generates two signals, DivI and DivT, based on the signal $F_{DIV}$ 326. Both of the signals DivI and DivT have frequencies equal to the frequency of the signal $F_{DIV}$ 326. The rising edge of the signal DivI is in phase with the rising edge of the signal $F_{DIV}$ 326, and the falling edge of the signal DivT is in phase with the falling edge of the signal $F_{DIV}$ 326.

A phase detector (PD) 302 receives the signals DivI, DivT and a reference signal $F_{REF}$ 330. Generally speaking, the PD 302 generates control signals based on the signals DivI, DivT and the reference signal $F_{REF}$ 330. The control signals control a phase charge pump 304. A frequency detector (FD) 306 also receives the signals DivI, DivT and the reference signal $F_{REF}$ 330. Generally speaking, the FD 306 generates control signals based on the signals DivI, DivT and a reference signal $F_{REF}$ 330. These control signals control a frequency charge pump 308. The PD charge pump 304 drives a first loop filter 310 and the FD 308 drives a second loop filter 312. The loop filters 310, 312 are combined at summing circuit 314, which provides a control voltage for the voltage controlled oscillator 316.

As shown, two separate feedback paths exist for the output $F_{VCO}$ 318. A first, a phase loop, goes through the divider 320, the DivI/DivT circuit 328, the PD 302, PD charge pump 304, and phase loop filter 310 to the voltage controlled oscillator 316 through sum circuit 314. A second, a frequency loop, also goes through the divider 320 and the DivI/DivT circuit 328, goes through the FD 306, frequency detector charge pump 308, and frequency loop filter 312 to the voltage controlled oscillator 316 through sum circuit 314. More detailed discussions of the operation of the fractional-N PLL 300 are provided below.

Figure 4A:
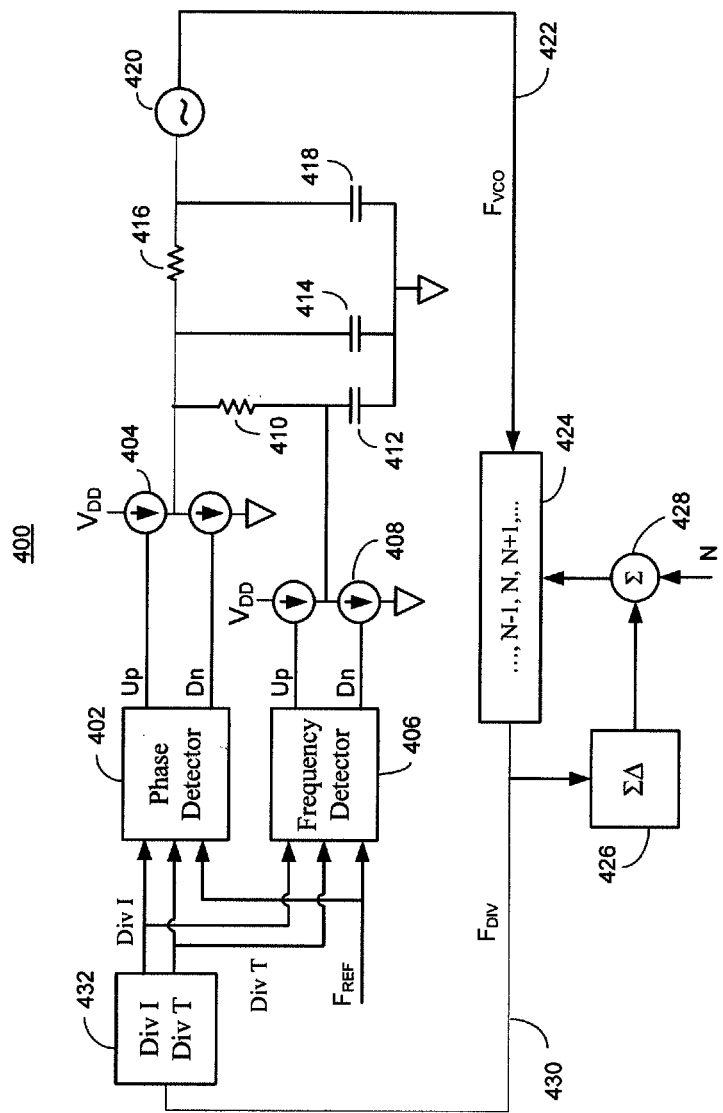
FIG. 4A is a block diagram of an embodiment of the delta-sigma controlled fractional-N synthesizer of FIG. 3.

FIG. 4A is a fractional-N PLL 400 that illustrates one embodiment of the first and second loop filters 310, 312 and the summing circuit 314 of FIG. 3. The configuration of the PD 402, phase charge pump 404, FD 406, frequency charge pump 408 are as shown in FIG. 3. Also similar to the configuration of FIG. 3, are voltage controlled oscillator 420, N divider 424, delta-sigma modulator 426, and DivI/DivT circuit 432.

The loop filter (310) for the PD 402/phase charge pump 404 has the output of the phase charge pump 404 coupled to resistors 410 and 416 and capacitor 414. Resistor 410 is coupled to ground via a capacitor 412, and resistor 416 is coupled to ground via a capacitor 418. The resistor 410/capacitor 412 pair creates a zero in a transfer characteristic of the loop filter (310) for the PD 404. This zero in the transfer characteristic of the loop filter 310 is discussed further below.

The loop filter (312) for the FD 406/frequency charge pump 408 has the output of the frequency charge pump 408 coupled to the capacitor 412. Thus, the output of the charge pump 408 is coupled to ground via the capacitor 412. Additionally, the output of the frequency charge pump 408 is coupled to resistor 410. The other end of resistor 410 is coupled to a capacitor 414, which is also coupled to ground. Thus, the output of the charge pump is coupled to ground via the resistors 410, 416 and the capacitor 418, in series.

Figure 4B:
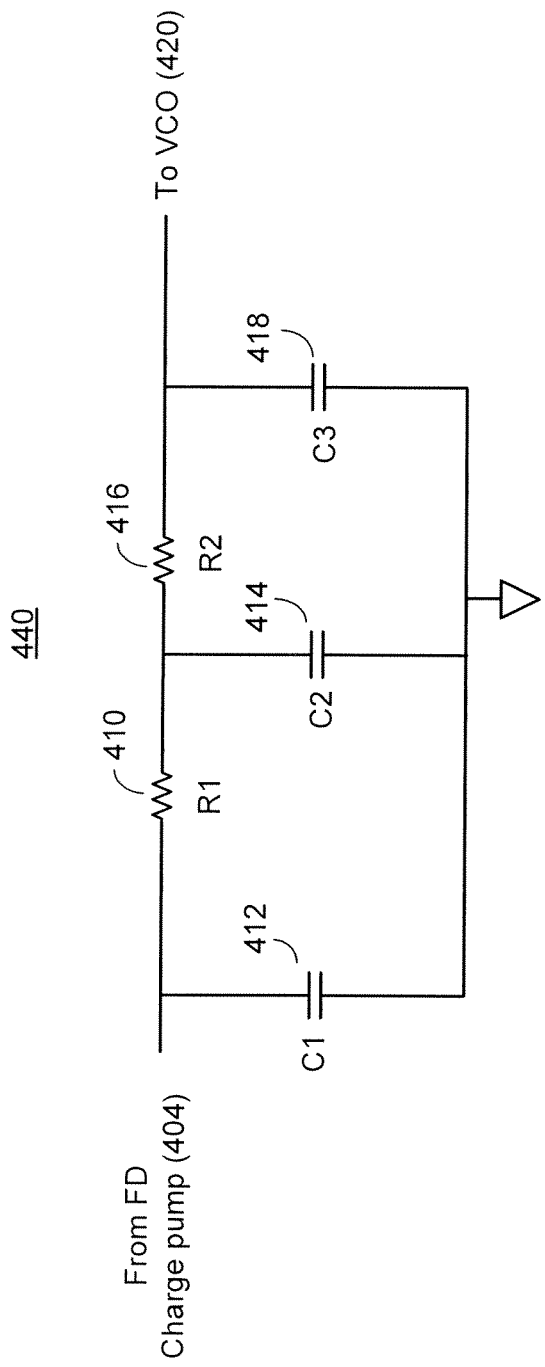
FIG. 4B is a circuit diagram of an embodiment of a frequency detector third order loop filter.

FIG. 4B is a circuit diagram of an exemplary frequency loop filter 440, such as that illustrated in FIG. 4A. Resistors R1 410, R2 416, and capacitors C1 412, C2 414, and C3 418 are connected in a network as depicted. The impedance of the frequency loop filter 440 is given by the equation:

$$Z_{fd}(s) = \frac{1}{s(C_1 + C_2)} \times \frac{1}{(1 + sR_2C_3)} \times \frac{1}{\left(1 + s\frac{R_1C_2C_1}{(C_1 + C_2)}\right)} \quad \text{(Equ. 1)}$$

The frequency loop filter 440 has no zeros, only poles, in its impedance.

Figure 4C:
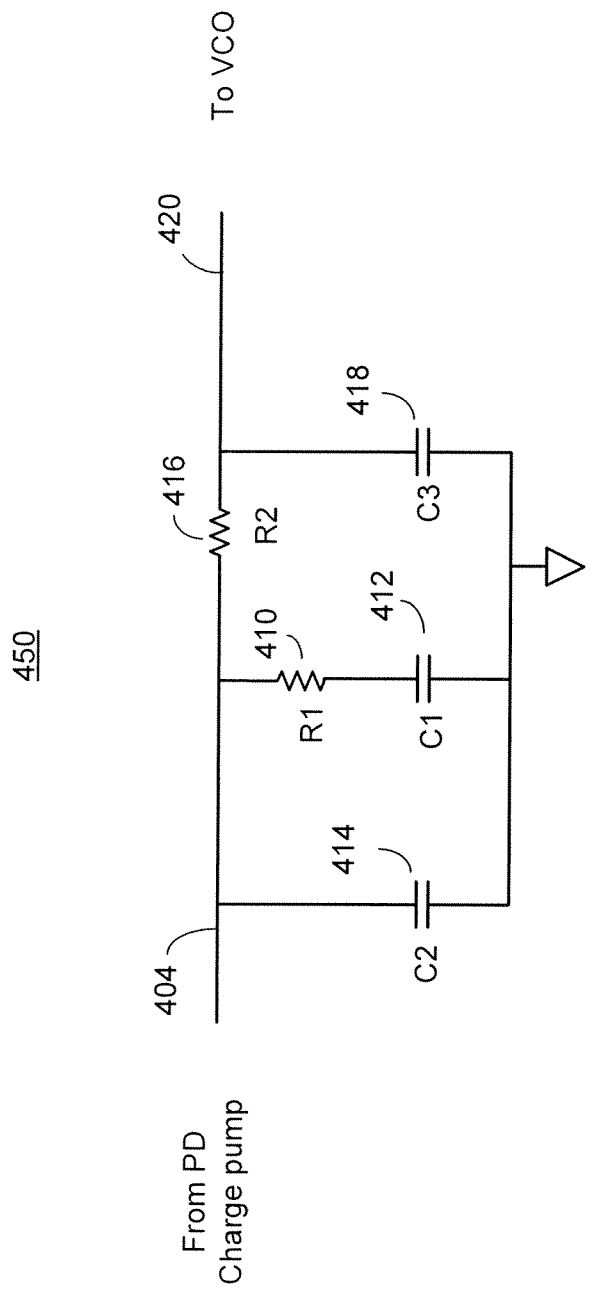
FIG. 4C is a circuit diagram of an embodiment of a phase detector third order loop filter.

FIG. 4C is a circuit diagram of an exemplary phase loop filter 450, such as that illustrated in FIG. 4A. Resistors R1 410, R2 416, and capacitors C1 412, C2 414, and C3 418 are connected in a network as depicted. The resistor R1 410 and capacitor C1 412 add a zero to the impedance of the phase loop filter 450. The phase loop filter 450 and frequency loop filter 440 have poles at the same frequencies. In the absence of any zeros, $Z_{fd}(s)$ gives the frequency loop a higher unity gain loop frequency than that of the phase loop. In operation, this allows the frequency loop to settle faster than the phase loop.

Figure 5:
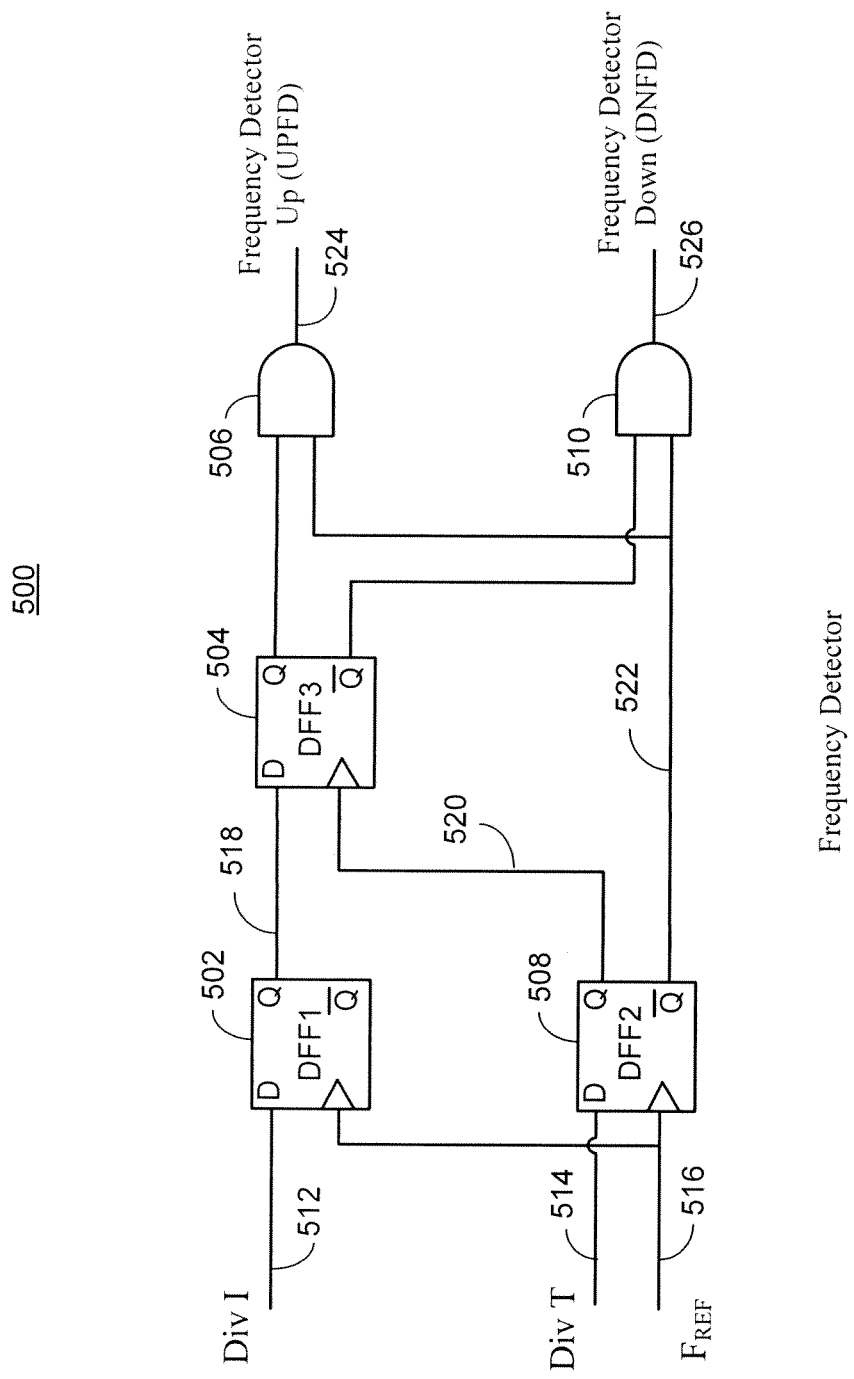
FIG. 5 is block diagram of a frequency detector suitable for use in the delta-sigma controlled fractional-N synthesizer of FIG. 3.

FIG. 5 is an illustrative embodiment of a frequency detector (FD) 500, such as the frequency detector 306 of FIG. 3, and will be discussed with reference to FIG. 3 for ease of explanation. The objective of the FD 500 is to lock the feedback divider signals (DivI 512 and DivT 514) to a reference signal $F_{REF}$ 516. Each of D flip-flop 1 (DFF1) 502 and D flip-flop 2 (DFF2) 508 is triggered at the rising edge of the $F_{REF}$ 516. DFF1 502 and DFF2 508 work as a digital mixer and the output signal 518 is indicative of the frequency difference between the $F_{DIV}$ 326 of FIG. 3 and the $F_{REF}$ 516 signal. This output signal 518 is provided as a D input to D flip-flop 3 (DFF3) 504. The polarity of the frequency difference between $F_{DIV}$ 326 and $F_{REF}$ 516 decides the polarity of the output of DFF3 504. This in-turn determines which output, up frequency (UPFD) 524 or down frequency (DNFD) 526, is high. So accordingly, the FD charge pump 308 (FIG. 1) either sources charge to the loop filter 312 or sinks charge from the loop filter 312.

After a frequency lock is achieved the output 522 of DFF2 508 is 0. This disables the UPFD 524 and DNFD 526 signals. So the FD 500 is operational only when there is frequency difference between $F_{DIV}$ 326 and $F_{REF}$ 516. Once the frequency lock is achieved the FD 500 is turned off, that is, both UPFD 524 and DNFD 526 are 0. This leads to the frequency detector charge pump 308 to be turned off in a tri-state mode. The gain of frequency loop is independent of the $F_{REF}$ 516 clock frequency. Simulations show that for a constant frequency difference between $F_{DIV}$ 326 and $F_{REF}$ 516, the amount of charge dumped by the frequency detector charge pump 308 to the loop filter 312 in a given time, is independent of the frequency of $F_{REF}$ 516. This means that the gain of the FD 306 is independent of the magnitude of $F_{REF}$ 516. The gain of FD 306 is ±½, where the polarity indicates whether the UPFD 524 is on or DNFD 526 is on.

Figure 6A:
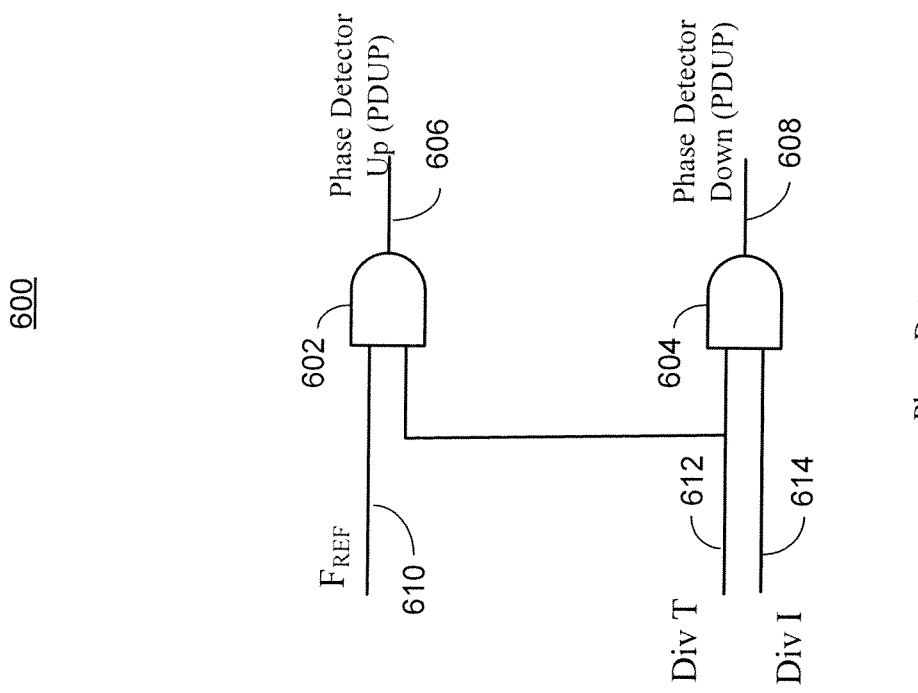
FIG. 6A is a block diagram of a phase detector suitable for use in the delta-sigma controlled fractional-N synthesizer of FIG. 3.

FIG. 6A is an illustrative embodiment of a phase detector (PD) 600, such as the phase detector 302 of FIG. 3. The PD 600 consists of AND gates 602 and 604. The input to PD 600 includes the same three signals as that of the frequency detectors, $F_{REF}$ 610, DivI 614, and DivT 612.

Figure 2:
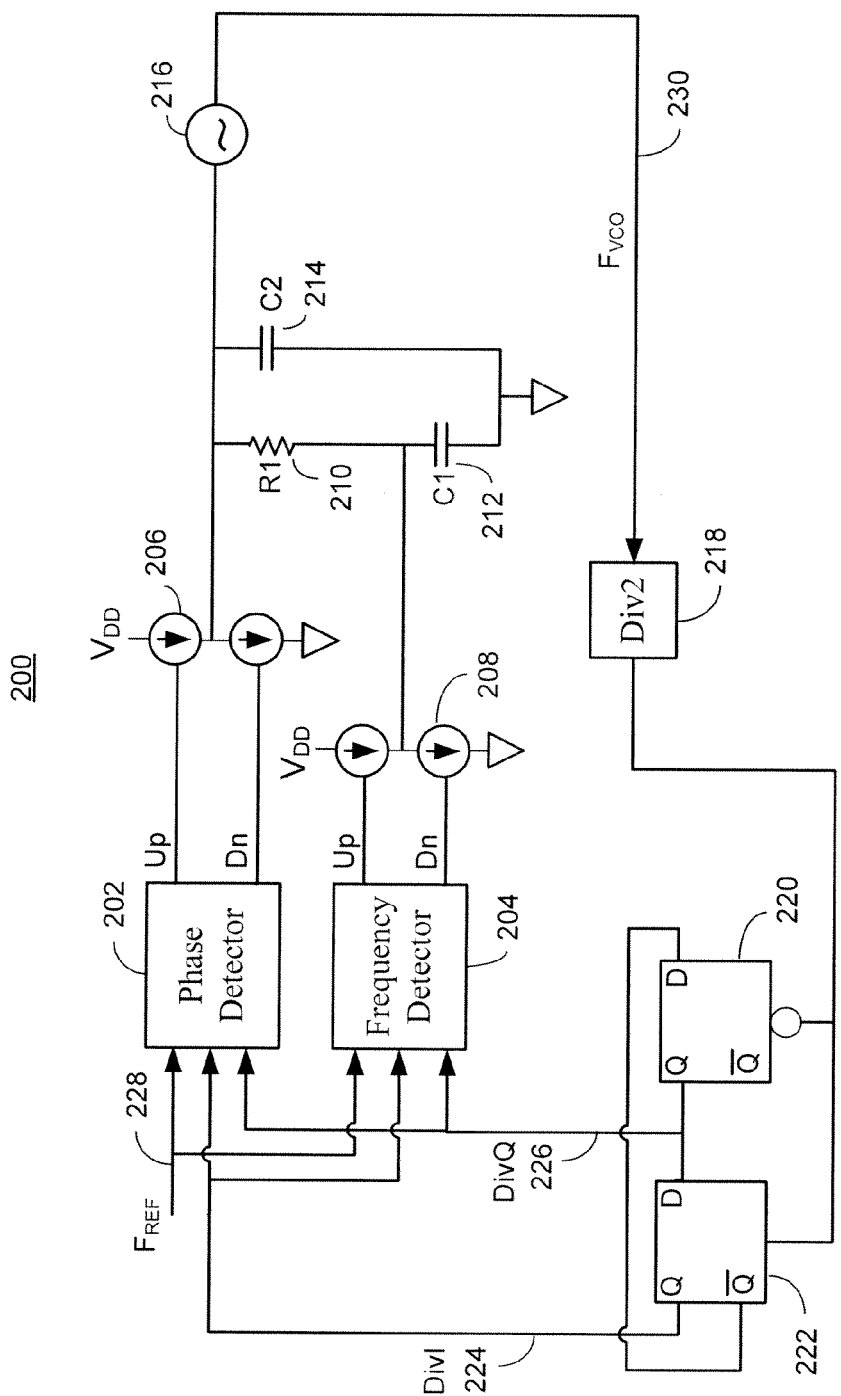
FIG. 2 is a block diagram of a prior art quadrature clock multiplier.

If the phase difference between DivI 614 and DivT 612 is fixed, as discussed below with respect to FIG. 7, then the PD down 608 is always of constant pulse width (before and after phase locking has taken place). The PD up signal 606 is of varying pulse width. In the case of the integer-N PLL of FIG. 2, after phase lock has taken place, the PDUP 606 and PDDN 608 signals are of constant width. In the frac-N circuit of FIG. 3, after lock, the PDDN 608 will have a constant width but PDUP 606 will have a varying pulse width that depends on the delta-sigma modulator (DSM) induced timing error at the input of the PD 600.

Figure 6B:
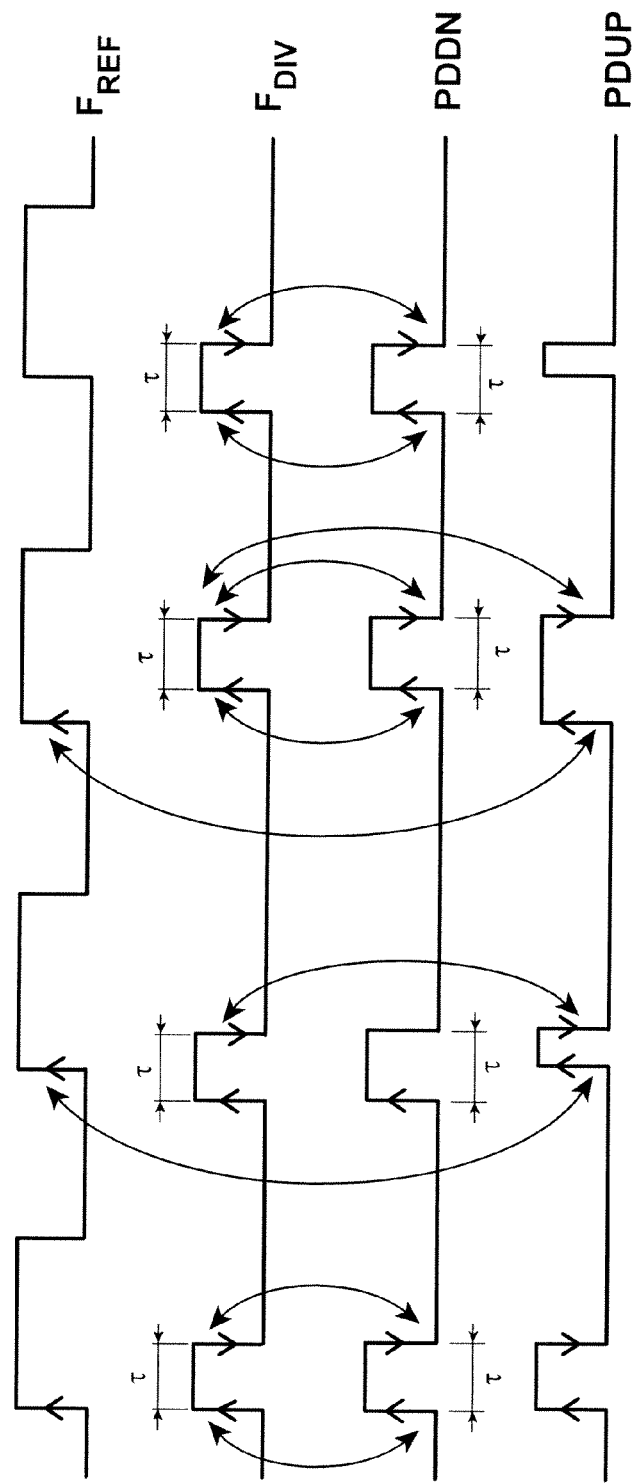
FIG. 6B is a timing chart showing pulse generation in the phase detector of FIG. 6A.

Turning briefly to FIG. 6B, the relationship between PDUP 606 and PDDN 608 is illustrated. PDDN 608 transitions in synchronization with $F_{DIV}$, so that PDDN 608 has constant pulse-widths, τ. Pulses of PDUP 606, however, have rising edges triggered by rising edges of $F_{REF}$ and falling edges triggered by falling edges of $F_{DIV}$ (see FIGS. 7A/7B for more detail). Therefore, in this embodiment, the pulse width of PDUP 606 may vary with the phase differences between $F_{REF}$ and $F_{DIV}$. In other embodiments, PDUP 606 may have constant pulse-widths and PDDN 608 have a variable pulse width.

Figures 7A, 7B:
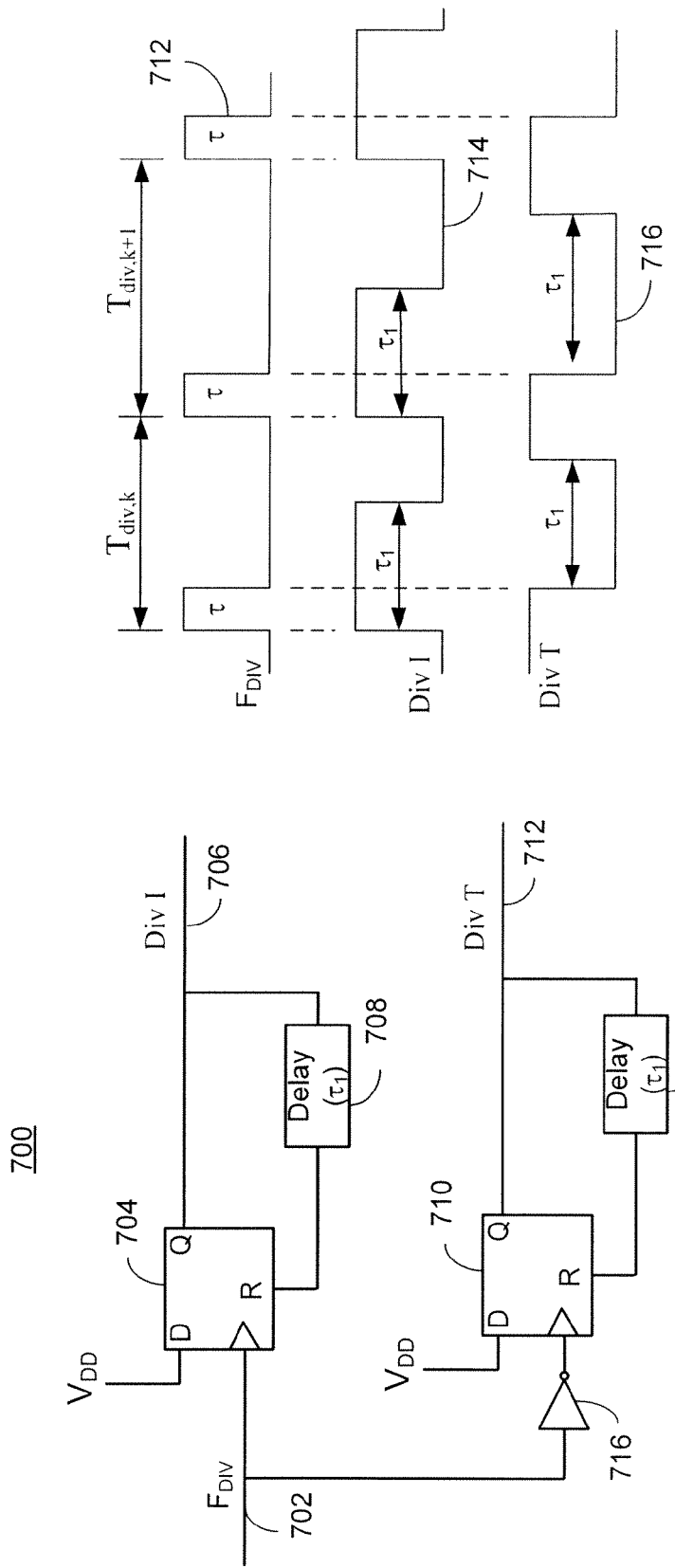
FIG. 7A is a block diagram of Div I-Div T circuit suitable for use in the delta-sigma controlled fractional-N synthesizer of FIG. 3.
FIG. 7B is a timing diagram for the circuit of FIG. 7A.

Returning to FIG. 6A, there is a fundamental difference between the operation of FD charge pump 308 and the PD charge pump 304 of FIG. 3. The inputs to FDCP 308 are FDDN 526 and FDUP 524. As can be seen from circuitry of FIG. 5, these inputs cannot be both on (high) at the same time. This is in contrast to the operation of the PDCP 304 wherein the inputs, PDUP 606 and PDDN 608 both can be on (high) at the same time. FIG. 7A illustrates an exemplary circuit 700 for generating the DivI and DivT signals 332 and 334 respectively. The prior art circuit of FIG. 2 generates a DivI signal 224 and a DivQ signal 226 that are 90 degrees out of phase. In contrast, the circuit 700 generates a DivI signal from the rising edge of $F_{DIV}$ 702, the feedback divider pulse, and a separate DivT signal from the falling edge of $F_{DIV}$ 702.

The circuit 700 includes a first D flip-flop 704 driven by input signal $F_{DIV}$ 702 and whose output DivI 706 is fed back to the reset input via delay circuit 708. The delay circuit 708 delays signal edges by time $\tau_1$. The circuit 700 also includes a second D flip-flop 710. $F_{DIV}$ 702 is inverted by inverter 716 and used to drive the clock input of the second DFF 710. The output DivT 712 is fed back to the reset input of DFF 710 via delay circuit 714 that delays the signal edges of DivT 712 by the same time $\tau_1$ as delay circuit 708.

FIG. 7B illustrates signal relationships in the circuit 700 of FIG. 7A. The signal $F_{DIV}$ 712 corresponds to signal $F_{DIV}$ 702 of FIG. 7A. The rising edges of $F_{DIV}$ are not uniformly spaced and are shown as having periods $T_{div,k}$ and $T_{div,k+1}$ (where k refers to the $k^{th}$ clock cycle). The DivI signal 714 transitions high on the rising edge of $F_{DIV}$ 712 and transitions low after time period $\tau_1$, as long as $\tau_1$ is greater than the pulse width of $F_{DIV}$ 712. The DivT signal 716 transitions low on the falling edge of $F_{DIV}$ 712 and transitions high after time period $\tau_1$ as long as the time between falling edges of $F_{DIV}$ 712 is greater than $\tau_1$.

Referring back to FIG. 3, some characteristics of the embodiment of the fractional-N PLL 300 are discussed. The PD 302 down signal will have a constant pulse width equal to the phase difference between DivI 332 and DivT 334. During locking the PD 302 up signal will have a varying pulse width. The PD charge pump 304 is reset by the falling edge of DivT 334.

Figure 1:
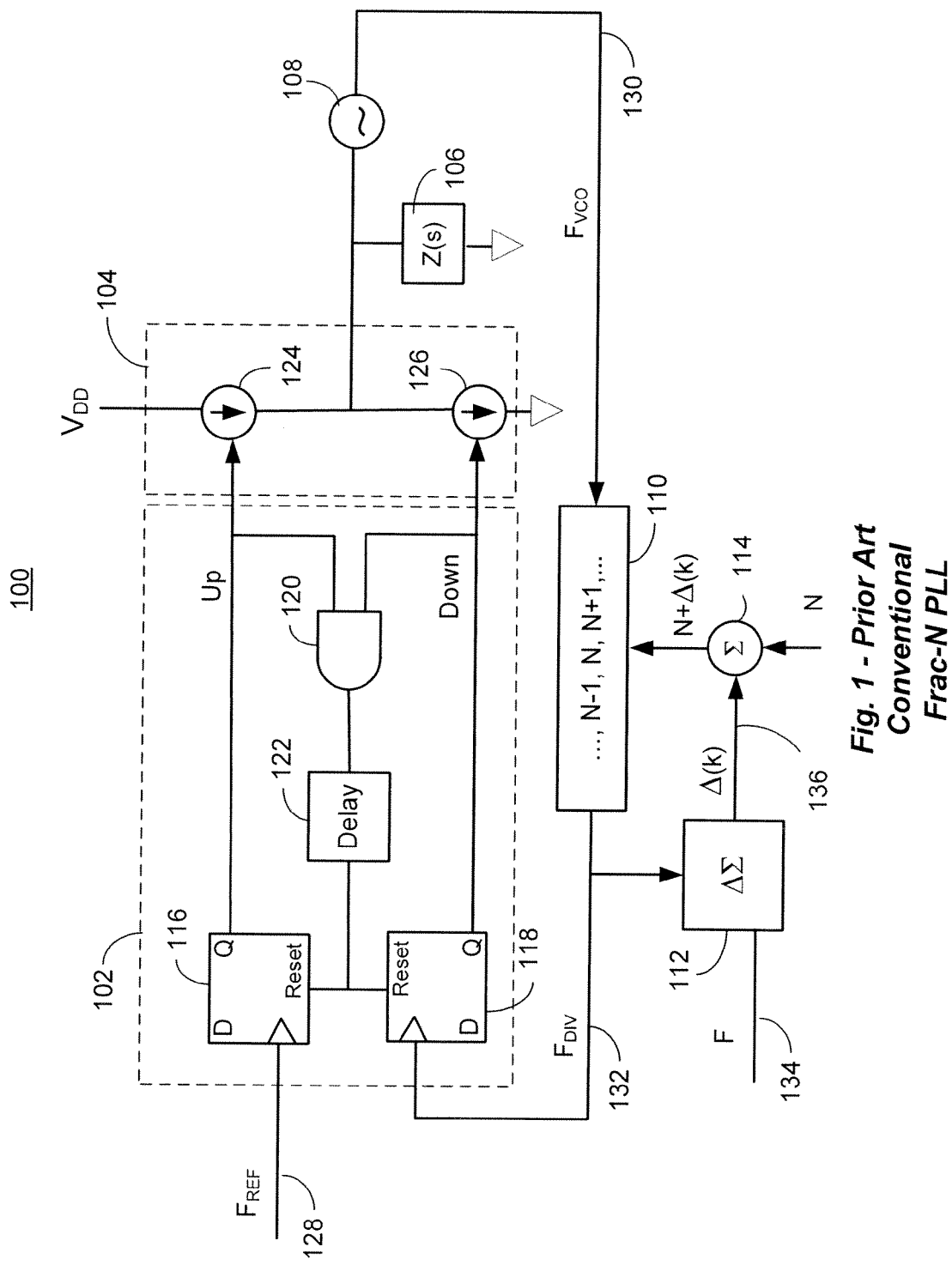
FIG. 1 is a block diagram of a prior art fractional-N PLL.

In the embodiment of FIG. 3, several advantages in terms of noise performance over the prior art circuit of FIG. 1 are realized by this configuration. One, because the PD down charge pump is a constant current, a dynamic mismatch noise exists only for the PD up charge pump element 336. Two, charge pump gain mismatch noise is eliminated. Three, a reset delay mismatch is eliminated because the falling edge of DivT 334 is referenced to the falling edge of Fdiv 326 and is used to reset the output of both the up and down PD charge pump elements 336 and 338, respectively. Each are discussed further below.

After locking (in fractional-N mode), the PD 302 down signal will have a constant pulse width, and the PD 302 up signal will have a time-varying pulse width corresponding to timing errors induced by the delta sigma modulator 324. This timing error can be of either polarity, resulting in the instantaneous PD 302 up pulse width to be more or less than that of the PD 302 down pulse width.

Frac-N PLL noise degrades due to several non-linearities. These include: a. gain mismatch in the up and down charge pump elements; b. dynamic mismatch in the up and down charge pump elements due to finite rise and fall times in the charge pump; and c. reset delay mismatch noise.

In the illustrated embodiment, the down charge pump element 338 is on for a fixed period of time in every reference clock period thus pumping a fixed amount of charge every reference clock cycle irrespective of the delta sigma modulator 324 induced timing error at the input of the PD 302. Hence, noise due to non-linearity of charge pump element gain mismatch is eliminated. It is known that charge pump gain mismatch is responsible for noise folding in prior art frac-N PLLs. This also reduces the down charge pump element 338 dynamic mismatch noise in frac-N mode associated with the finite rise-time and fall-time of the down charge pump element 338.

Reset-delay mismatch is also responsible for noise-folding. This topology of PD 302, in conjunction with DivI/DivT circuit 328 is immune to reset delay mismatch noise. This is because the same edge (falling edge of $F_{DIV}$) is used to reset the PD charge pump 304, without respect to a timing error at the input of the phase and frequency detector. The linearization of the phase detector and frequency detector of the frac-N PLL is independent of the order, topology, and clock frequency of the sigma delta (ΣΔ) modulator.

To summarize, operation of one of the phase detector charge pump elements 336, 338, in this case down charge pump element 338, operating with a constant duty-cycle while in frac-N mode, linearizes the charge pump 304. In an alternate embodiment, this linearization can be done by making the pulse width phase detector 302 up signal fixed at every reference clock period and instead making the phase detector 302 down pulse width controlled by delta sigma modulator 324 timing errors. This technique will also linearize the PD charge pump 304.

Figure 8:
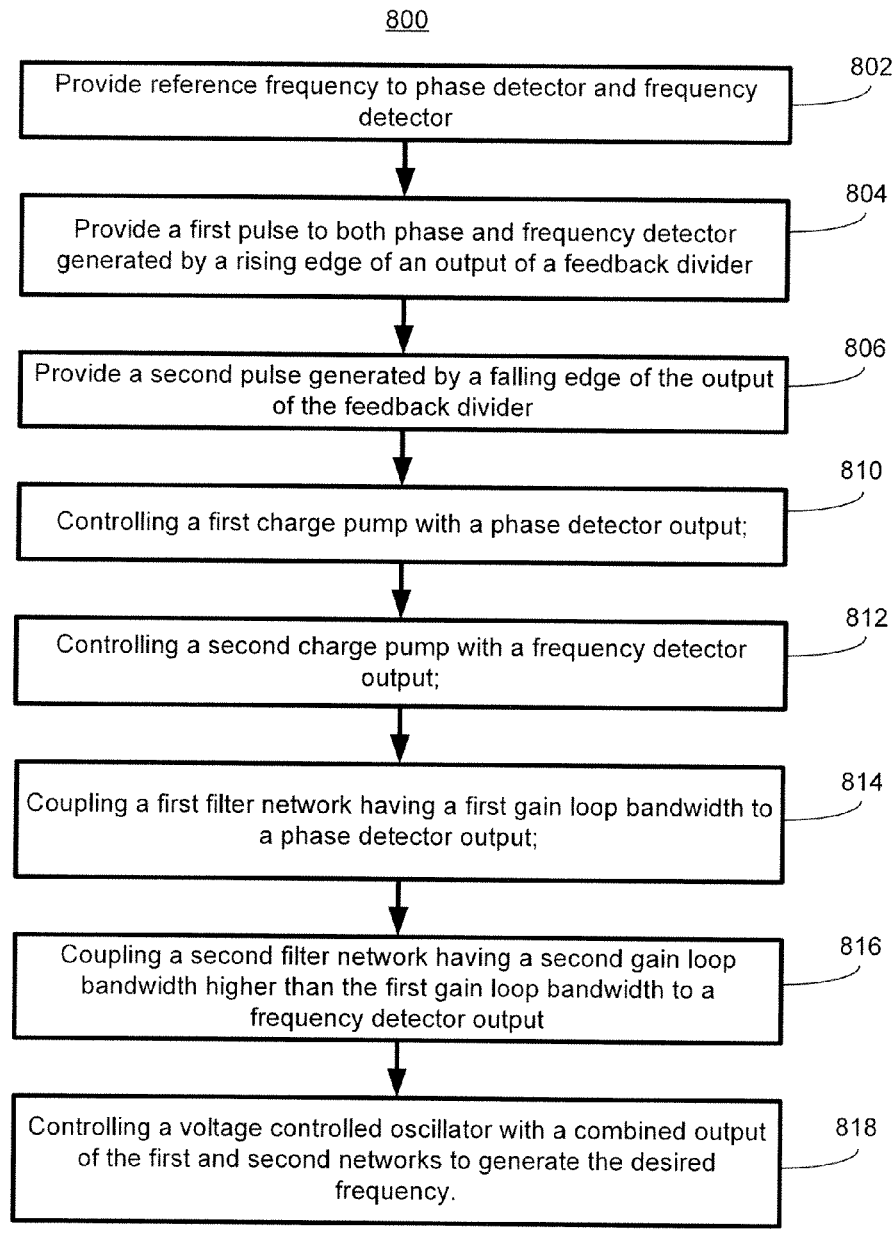
FIG. 8 is a flow chart of a method of operating a delta-sigma controlled fractional-N synthesizer using a separate phase detector and frequency detector.

FIG. 8 describes an embodiment of a method 800 of operating a fractional-N PLL to generate a desired frequency from a reference frequency. The method 800 may be implemented by a PLL such as the PLL 300, for example. The method 800 will be described with reference to FIG. 3 for ease of explanation. It is to be understood, however, that the method 800 may be implemented by PLL's other than the PLL 300 of FIG. 3.

At block 802, a reference frequency 330 may be provided to both a phase detector 302 and a frequency detector 306. The reference frequency 330 may be generated by a time base or clock signal (not depicted).

At block 804, a first pulse, DivI 332 may be generated by a DivI/DivT circuit 328 using a rising edge of a frequency divided signal, $F_{DIV}$ 326, generated by an N divider 320 and providing the DivI pulse 332 to both the phase detector 302 and the frequency detector 306. The DivI/DivT circuit 328 may trigger a D-type flip-flop 704 on the rising edge of the output of the feedback N divider 320 and reset the D-type flip-flop 704 after a delay period following the rising edge.

At block 806, a second pulse. DivT 334, may be generated by the DivI/DivT circuit 328 using a falling edge of the output of the feedback N divider 320 and providing the DivT pulse 334 to both the phase detector 302 and the frequency detector 306. The DivI/DivT circuit 328 may invert the signal, $F_{DIV}$ 326, so that a second D-type flip-flop 710 is triggered on the falling edge of the signal $F_{DIV}$ and resetting the D-type flip-flop 710 after a delay period.

At block 810, the phase detector 302 output may control a first charge pump 304 to draw a consistent charge by a first charge pump 338 and supply a variable charge from a second charge source 336. In another embodiment, a consistent charge may be supplied from the second charge source 336 and the first charge sink 336 may draw a variable charge.

At block 812, a second charge pump 308 may be controlled by an output of the frequency detector 306. The frequency detector 306 may place the second charge pump 308 in an inoperable, tri-state mode when after a frequency lock is achieved with the output of the feedback N divider, $F_{DIV}$ 326.

At block 814, a first filter network 310, having a first gain loop bandwidth, may be coupled to a phase detector output. A voltage developed across the first filter network 310 may be used to control a voltage controller oscillator 316.

At block 816, a second filter network 312, having a second gain loop bandwidth higher than the first gain loop bandwidth, to a frequency detector output. At block 818, a voltage developed across the second filter network 312 may be combined the voltage developed across the first filter network 310 to control the voltage controlled oscillator 316.

FIGS. 9A-9F, illustrate various devices in which a delta sigma controlled fractional-N synthesizer may be employed.

Figure 9A:
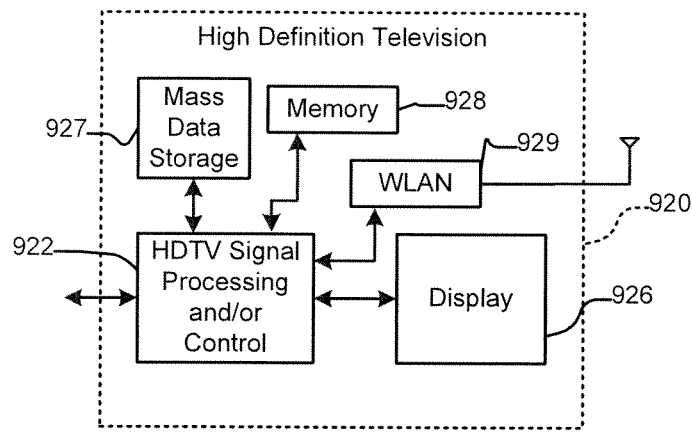
FIGS. 9A-9F illustrate embodiments of circuits that may incorporate a delta-sigma controlled fractional-N synthesizer.

Referring now to FIG. 9A, such techniques may be utilized in a high definition television (HDTV) 920. HDTV 920 includes a mass data storage 927, an HDTV signal processing and control block 922, a WLAN interface and memory 928. HDTV 920 receives HDTV input signals in either a wired or wireless format and generates HDTV output signals for a display 926. In some implementations, signal processing circuit and/or control circuit 922 and/or other circuits (not shown) of HDTV 920 may process data, perform coding and/or encryption, perform calculations, format data and/or perform any other type of HDTV processing that may be required.

HDTV 920 may communicate with a mass data storage 927 that stores data in a nonvolatile manner such as optical and/or magnetic storage devices. The mass storage device may be a mini HDD that includes one or more platters having a diameter that is smaller than approximately 1.8". HDTV 920 may be connected to memory 928 such as RAM, ROM, low latency nonvolatile memory such as flash memory and/or other suitable electronic data storage. HDTV 920 also may support connections with a WLAN via a WLAN network interface 929. Both the HDTV signal processor 922 and the WLAN network interface 929 may use a delta sigma controlled fractional-N synthesizer.

Figure 9B:
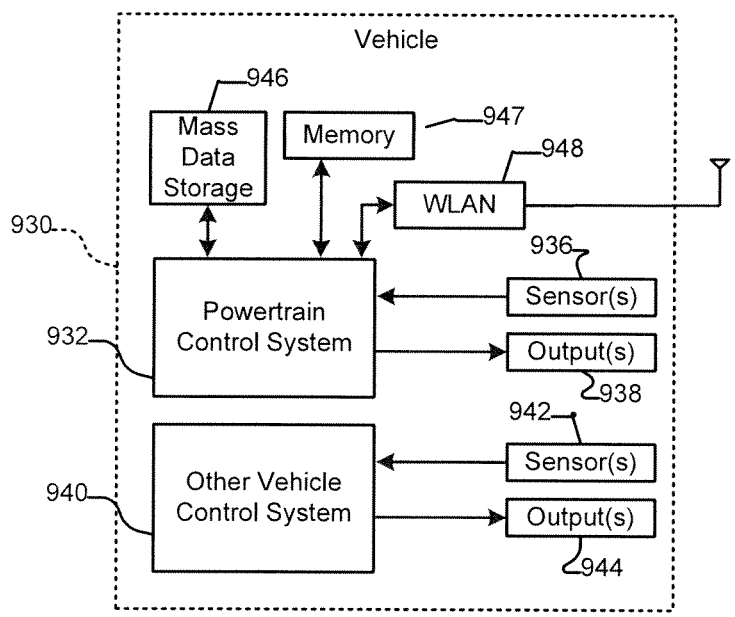

Referring now to FIG. 9B, such techniques may be utilized in a vehicle 930. The vehicle 930 includes a control system that may include mass data storage 946, as well as a WLAN interface 948. The mass data storage 946 may support a powertrain control system 932 that receives inputs from one or more sensors 936 such as temperature sensors, pressure sensors, rotational sensors, airflow sensors and/or any other suitable sensors and/or that generates one or more output control signals 938 such as engine operating parameters, transmission operating parameters, and/or other control signals.

Control system 940 may likewise receive signals from input sensors 942 and/or output control signals to one or more output devices 944. In some implementations, control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like.

Powertrain control system 932 may communicate with mass data storage 927 that stores data in a nonvolatile manner such as optical and/or magnetic storage devices. The mass storage device 946 may be a mini HDD that includes one or more platters having a diameter that is smaller than approximately 1.8". Powertrain control system 932 may be connected to memory 947 such as RAM, ROM, low latency nonvolatile memory such as flash memory and/or other suitable electronic data storage. Powertrain control system 932 also may support connections with a WLAN via a WLAN network interface 948. The control system 940 may also include mass data storage, memory and/or a WLAN interface (all not shown). In one exemplary embodiment, the WLAN network interface 948 may implement delta sigma controlled fractional-N synthesizer.

Figure 9C:
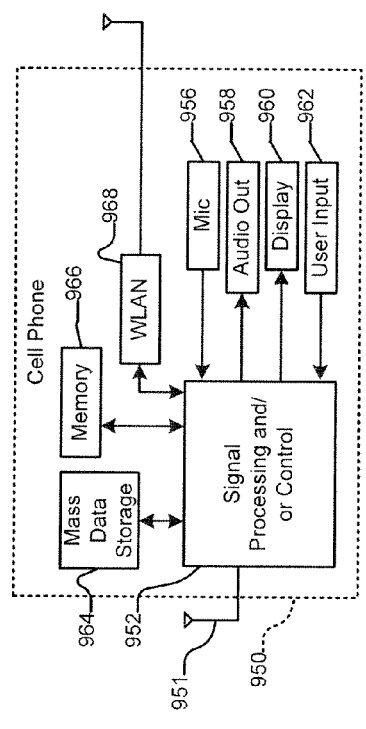

Referring now to FIG. 9C, such techniques may be used in a cellular phone 950 that may include a cellular antenna 951. The cellular phone 950 may include either or both signal processing and/or control circuits, which are generally identified in FIG. 9C at 952, a WLAN network interface 968 and/or mass data storage 964 of the cellular phone 950. In some implementations, cellular phone 950 includes a microphone 956, an audio output 958 such as a speaker and/or audio output jack, a display 960 and/or an input device 962 such as a keypad, pointing device, voice actuation and/or other input device. Signal processing and/or control circuits 952 and/or other circuits (not shown) in cellular phone 950 may process data, perform coding and/or encryption, perform calculations, format data and/or perform other cellular phone functions. The signal processing and control circuits 952 may employ a delta sigma controlled fractional-N synthesizer.

Cellular phone 950 may communicate with mass data storage 964 that stores data in a nonvolatile manner such as optical and/or magnetic storage devices for example hard disk drives HDD and/or DVDs. The HDD may be a mini HDD that includes one or more platters having a diameter that is smaller than approximately 1.8". Cellular phone 950 may be connected to memory 966 such as RAM. ROM, low latency nonvolatile memory such as flash memory and/or other suitable electronic data storage. Cellular phone 950 also may support connections with a WLAN via a WLAN network interface 968 may implement delta sigma controlled fractional-N synthesizer.

Figure 9D:
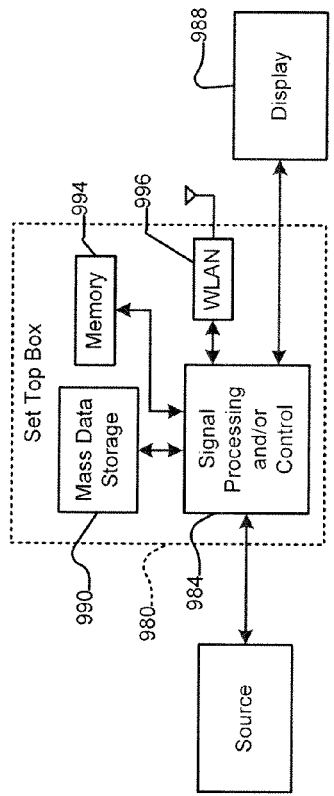

Referring now to FIG. 9D, such techniques may be utilized in a set top box 980. The set top box 980 may include either or both signal processing and/or control circuits, which are generally identified in FIG. 9D at 984, a WLAN interface and/or mass data storage 990 of the set top box 980. Set top box 980 receives signals from a source such as a broadband source and outputs standard and/or high definition audio/video signals suitable for a display 988 such as a television and/or monitor and/or other video and/or audio output devices. Signal processing and/or control circuits 984 and/or other circuits (not shown) of the set top box 980 may process data, perform coding and/or encryption, perform calculations, format data and/or perform any other set top box function. The signal processing and control circuits 984 may employ a delta sigma controlled fractional-N synthesizer.

Set top box 980 may communicate with mass data storage 990 that stores data in a nonvolatile manner and may use jitter measurement. Mass data storage 990 may include optical and/or magnetic storage devices for example hard disk drives HDD and/or DVDs. The HDD may be a mini HDD that includes one or more platters having a diameter that is smaller than approximately 1.8". Set top box 980 may be connected to memory 994 such as RAM, ROM, low latency nonvolatile memory such as flash memory and/or other suitable electronic data storage. Set top box 980 also may support connections with a WLAN via a WLAN network interface 996. The WLAN network interface may implement delta sigma controlled fractional-N synthesizer.

Figure 9E:
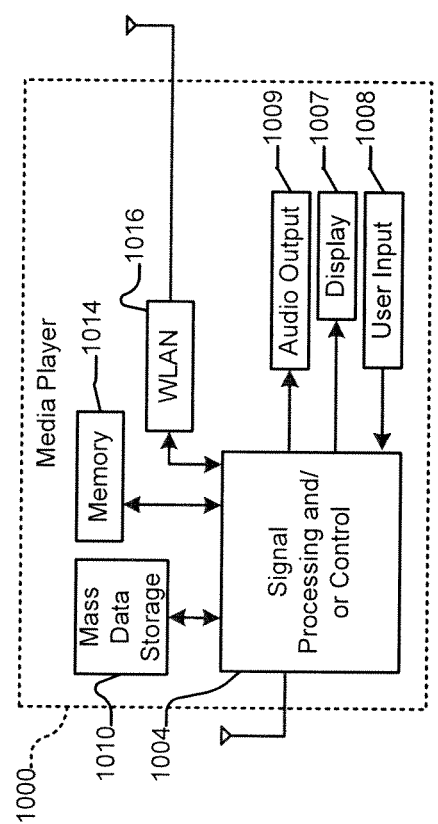

Referring now to FIG. 9E, such techniques may be used in a media player 1000. The media player 1000 may include either or both signal processing and/or control circuits, which are generally identified in FIG. 9E at 1004, a WLAN interface and/or mass data storage 1010 of the media player 1000. In some implementations, media player 1000 includes a display 1007 and/or a user input 1008 such as a keypad, touchpad and the like. In some implementations, media player 1000 may employ a graphical user interface (GUI) that typically employs menus, drop down menus, icons and/or a point-and-click interface via display 1007 and/or user input 1008. Media player 1000 further includes an audio output 1009 such as a speaker and/or audio output jack. Signal processing and/or control circuits 1004 and/or other circuits (not shown) of media player 1000 may process data, perform coding and/or encryption, perform calculations, format data and/or perform any other media player function.

Media player 1000 may communicate with mass data storage 1010 that stores data such as compressed audio and/or video content in a nonvolatile manner and may utilize jitter measurement. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". Media player 1000 may be connected to memory 1014 such as RAM, ROM, low latency nonvolatile memory such as flash memory and/or other suitable electronic data storage. Media player 1000 also may support connections with a WLAN via a WLAN network interface 1016. The WLAN network interface 1016 and/or signal processing circuits 1004 may implement delta sigma controlled fractional-N synthesizer.

Figure 9F:
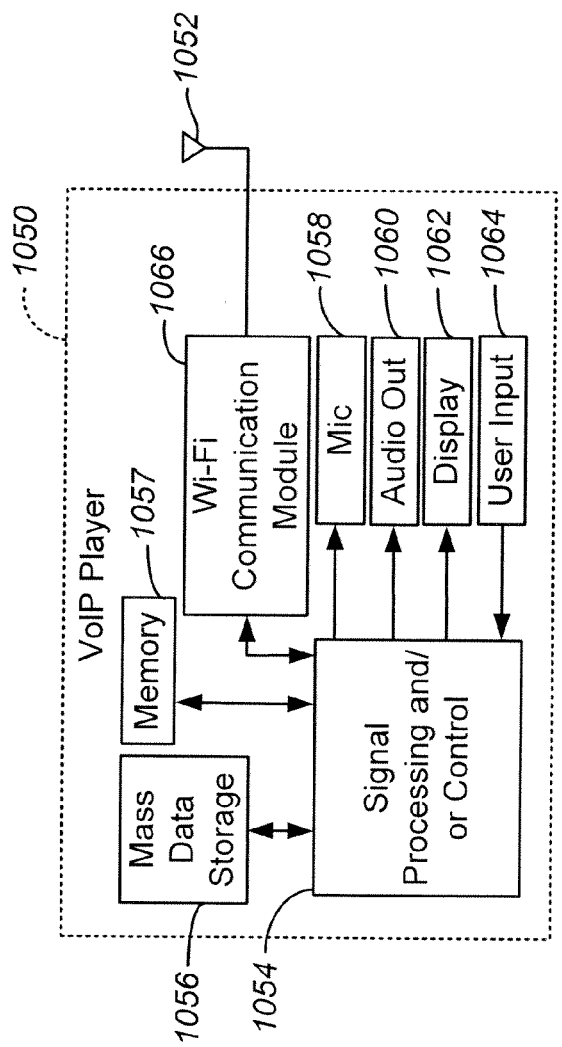

Referring to FIG. 9F, such techniques may be utilized in a Voice over Internet Protocol (VoIP) phone 1050 that may include an antenna 1052. The VoIP phone 1050 may include either or both signal processing and/or control circuits, which are generally identified in FIG. 9F at 1054, a wireless interface and/or mass data storage of the VoIP phone 1050. In some implementations, VoIP phone 1050 includes, in part, a microphone 1058, an audio output 1060 such as a speaker and/or audio output jack, a display monitor 1062, an input device 1064 such as a keypad, pointing device, voice actuation and/or other input devices, and a Wireless Fidelity (WiFi) communication module 1066. Signal processing and/or control circuits 1054 and/or other circuits (not shown) in VoIP phone 1050 may process data, perform coding and/or encryption, perform calculations, format data and/or perform other VoIP phone functions.

VoIP phone 1050 may communicate with mass data storage 1056 that stores data in a nonvolatile manner such as optical and/or magnetic storage devices, for example hard disk drives HDD and/or DVDs. The HDD may be a mini HDD that includes one or more platters having a diameter that is smaller than approximately 1.8". VoIP phone 1050 may be connected to memory 1057, which may be a RAM, ROM, low latency nonvolatile memory such as flash memory and/or other suitable electronic data storage. VoIP phone 1050 is configured to establish communications link with a VoIP network (not shown) via WiFi communication module 1066. The WiFi communication module 1066 may implement delta sigma controlled fractional-N synthesizer when communicating data via the WiFi communication module 1066 or via the audio output 1060 in communication with an accessory, such as a Bluetooth headset (not depicted).

The various blocks, operations, and techniques described above may be implemented in hardware, firmware, software, or any combination of hardware, firmware, and/or software.

When implemented in software, the software may be stored in any computer readable memory such as on a magnetic disk, an optical disk, or other storage medium, in a RAM or ROM or flash memory of a computer, processor, hard disk drive, optical disk drive, tape drive, etc. Likewise, the software may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, a wireless communication channel, the Internet, etc. (which are viewed as being the same as or interchangeable with providing such software via a transportable storage medium). When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

I claim:

1. A method of generating a signal having a desired frequency from a reference signal, the method comprising:
   providing the reference signal to both a phase detector and a frequency detector;
   generating a first signal that includes a first pulse synchronized with one of i) each rising edge of an output of an N-divider or ii) each falling edge of the output of the N-divider, the first pulse having a first pulse width determined by a first delay circuit;
   generating a second signal that includes a second pulse synchronized with the other one of i) each rising edge of the output of the N-divider or ii) each falling edge of the output of the N-divider, the second pulse having a second pulse width determined by a second delay circuit, the first and second pulse widths being of equal value, wherein the rising edge of the first pulse leads the falling edge of the second pulse by a pulse width of the output of the N-divider;
   providing the first signal to both the phase detector and the frequency detector;
   providing the second signal to both the phase detector and the frequency detector;
   controlling a first charge pump with an output of the phase detector;
   controlling a second charge pump with an output of the frequency detector;
   coupling a loop filter to the first charge pump and the second charge pump; and
   controlling a voltage controlled oscillator with an output of the loop filter to generate the signal having the desired frequency.

2. The method of claim 1, wherein coupling the loop filter to the first charge pump and the second charge pump comprises:
coupling a first filter network having a first unity gain loop bandwidth to the output of the phase detector; and
coupling a second filter network having a second unity gain loop bandwidth to the output of the frequency detector.

3. The method of claim 2, wherein the second unity gain loop bandwidth is higher than the first unity gain loop bandwidth.

4. The method of claim 1, wherein controlling the first charge pump comprises:
supplying i) a constant charge from a first charge source and ii) a variable charge from a second charge source.

5. The method of claim 1, wherein the first pulse is triggered on the rising edge of the output of the N divider and the second pulse is triggered on the falling edge of the output of the N divider.

6. A synthesizer, comprising:
a phase detector;
a frequency detector;
a first charge pump pair controlled by the phase detector;
a second charge pump pair controlled by the frequency detector;
a loop filter coupled to the first and second charge pump pairs;
a voltage controlled oscillator coupled to the loop filter;
an N-divider coupled to the voltage controlled oscillator; and
a pulse generation circuit coupled to i) the N-divider, ii) the phase detector and iii) the frequency detector, wherein the pulse generation circuit generates a first signal that includes a first pulse synchronized with one of i) each rising edge of an output of the N-divider or ii) each falling edge of the output of the N-divider, the first pulse having a first pulse width determined by a first delay circuit, and
wherein the pulse generation circuit generates a second signal that includes a second pulse synchronized with the other one of i) each rising edge of the output of the N-divider or ii) each falling edge of the output of the N-divider, the second pulse having a second pulse width determined by a second delay circuit, the first pulse width and the second pulse width being of equal value, wherein the rising edge of the first pulse leads the falling edge of the second pulse by a pulse width of the output of the N-divider.

7. The synthesizer of claim 6, further comprising a delta-sigma modulator coupled to the divider.

8. The synthesizer of claim 6, wherein the loop filter comprises i) a first filter coupled to the first charge pump pair, and ii) a second filter coupled to the frequency detector.

9. The synthesizer of claim 8, wherein the first filter contains a zero characteristic, and the second filter has no zero characteristic.

10. The synthesizer of claim 6, wherein the phase detector uses the first and second signals and a reference frequency to control the first charge pump pair.

11. The synthesizer of claim 6, wherein the frequency detector uses the first and second signals and a reference frequency to control the second charge pump pair.

12. A synthesizer for generating a frequency output, comprising:
a controlled oscillator means providing an output signal;
a means for (i) receiving the output signal and a dividing factor and (ii) dividing a frequency of the output signal to produce a first reference signal;
a pulse generator means for receiving the first reference signal and generating a first timing pulse and a second timing pulse, wherein the first timing pulse is pulse synchronized with one of i) each rising edge of the first reference signal or ii) each falling edge of the first reference signal, the first timing pulse having a first pulse width determined by a first delay circuit, and wherein the second timing pulse is synchronized with the other one of i) each rising edge of the first reference signal or ii) each falling edge of the first reference signal, the second timing pulse having a second pulse width determined by a second delay circuit, the first and second pulse widths being of equal value, wherein the rising edge of the first timing pulse leads the falling edge of the second timing pulse by a pulse width of the first reference signal;
a frequency detector means that receives the first and second timing pulses and a second reference signal to generate first control signals;
a frequency charge pump controlled by the first control signals;
a first loop filter means coupled to the frequency charge pump, the first loop filter means producing a first oscillator control signal that controls, in part, the controlled oscillator means;
a means for (i) receiving the first and second timing pulses and the second reference signal and (ii) detecting (a) a phase between the first and second timing pulses and (b) a phase between the first timing pulse and the second reference signal to generate second control signals;
a phase charge pump controlled by the second control signals; and
a second loop filter means coupled to the phase charge pump, the second loop filter means producing a second oscillator control signal that controls, in part, the controlled oscillator means.

13. The synthesizer of claim 12, further comprising a delta-sigma modulator for receiving the first reference signal and providing a feedback signal to the divider means.

14. The synthesizer of claim 12, wherein the pulse generator means ends the first timing pulse after a delay period following the triggering of the first timing pulse.

15. The synthesizer of claim 14, wherein the pulse generator means ends the second timing pulse after the delay period following the triggering of the second timing pulse.

16. The synthesizer of claim 12, wherein the frequency detector means and first loop filter are part of a first network having a first unity gain loop bandwidth; and
wherein the phase detector and second loop filter are part of a second network having a second unity gain loop bandwidth.

17. The synthesizer of claim 16, wherein the first unity gain loop bandwidth is higher than the second unity gain loop bandwidth.

* * * * *